(12) United States Patent
Parks

(10) Patent No.: US 7,896,974 B2
(45) Date of Patent: Mar. 1, 2011

(54) CHAMBER FOR WAFER CLEANING AND METHOD FOR MAKING THE SAME

(75) Inventor: John Parks, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 231 days.

(21) Appl. No.: 12/129,270

(22) Filed: May 29, 2008

(65) Prior Publication Data

US 2008/0223415 A1  Sep. 18, 2008

Related U.S. Application Data

(62) Division of application No. 10/404,472, filed on Mar. 31, 2003, now Pat. No. 7,392,815.

(51) Int. Cl.
*B08B 3/00* (2006.01)
*B08B 3/04* (2006.01)
*B08B 3/08* (2006.01)

(52) U.S. Cl. ............................ 134/34; 134/31; 134/902

(58) Field of Classification Search .................. 134/34, 134/21, 32, 22.12, 22.18, 31, 902
See application file for complete search history.

(56) References Cited

U.S. PATENT DOCUMENTS

| 6,589,361 B2 * | 7/2003 | Luscher et al. ............... 134/33 |
| 6,672,864 B2 * | 1/2004 | Wang et al. .................... 432/5 |
| 6,848,458 B1 * | 2/2005 | Shrinivasan et al. ......... 134/108 |

\* cited by examiner

*Primary Examiner* — Alexander Markoff
(74) *Attorney, Agent, or Firm* — Martine Penilla & Gencarella, LLP

(57) ABSTRACT

A wafer processing chamber "chamber" is provided. Broadly speaking, the chamber allows a fluid flow and a fluid pressure within the chamber to be controlled in a variable manner. More specifically, the chamber utilizes removable plates that can be configured to control the fluid flow and the fluid pressure in an inner volume within the chamber. Also, the removable plates can be used to separate the inner volume within the chamber from an outer volume within the chamber. In this manner, the removable plates can be used to create a pressure differential between the inner volume within the chamber and the outer volume within the chamber. A lower pressure in the outer volume within the chamber requires less outer chamber strength to withstand the lower pressure. A lower outer chamber strength requirement translates into an overall decrease in chamber size.

14 Claims, 14 Drawing Sheets

CHAMBER FOR WAFER CLEANING AND METHOD FOR MAKING THE SAME

CLAIM OF PRIORITY

This application is a divisional application of U.S. patent application Ser. No. 10/404,472, filed on Mar. 31, 2003, now U.S. Pat. No. 7,392,815, the disclosure of which is incorporated in its entirety herein by reference.

BACKGROUND OF THE INVENTION

1. Field of the Invention

The present invention relates generally to semiconductor wafer processing. More specifically, the present invention relates to an apparatus in which a semiconductor wafer can be cleaned.

2. Description of the Related Art

In the manufacture of semiconductor devices, a surface of a semiconductor wafer ("wafer" or "substrate") must be cleaned to remove chemical and particulate contamination. If the contamination is not removed, semiconductor devices on the wafer may perform poorly or become defective. Particulate contamination generally consists of tiny bits of distinctly defined material having an affinity to adhere to the surface of the wafer. Examples of particulate contamination can include organic and inorganic residues, such as silicon dust, silica, slurry residue, polymeric residue, metal flakes, atmospheric dust, plastic particles, and silicate particles, among others.

Wafer cleaning processes are generally performed by applying a fluid to the surface of the wafer. In some instances the fluid is applied to the wafer in a sealed chamber. The method of applying the fluid to the wafer can influence the effectiveness of the wafer cleaning process. For example, a specific fluid flow pattern over the surface of the wafer may provide beneficial cleaning results. Additionally, a specific fluid pressure applied over the surface of the wafer may provide beneficial cleaning results. Traditionally, different wafer cleaning chambers have been required to obtain different fluid flow patterns and fluid pressures over the surface of the wafer. The need to have a different wafer cleaning chambers to satisfy the requirements of a variety of wafer cleaning processes can present problems with respect to overall wafer processing cost and implementation. Also, wafer cleaning processes that require the use of high fluid pressures generally require the use of large wafer cleaning chambers to withstand the high pressure. Larger wafer cleaning chambers correspond to increased overall wafer processing cost.

In view of the foregoing, there is a need for a wafer cleaning chamber that allows for variable control of fluid pressures and fluid flow patterns as required to meet the needs of different wafer cleaning processes. The wafer cleaning chamber should also be able to accommodate wafers of different sizes. Furthermore, the wafer cleaning chamber should combine an ability to contain high pressures with an overall minimum size.

SUMMARY OF THE INVENTION

Broadly speaking, the present invention provides a wafer processing chamber "chamber" that allows a fluid flow and a fluid pressure within the chamber to be controlled in a variable manner. More specifically, the chamber of the present invention utilizes removable plates that can be configured to control the fluid flow and the fluid pressure in an inner volume within the chamber. Also, the removable plates can be used to separate the inner volume within the chamber from an outer volume within the chamber. In this manner, the removable plates can be used to create a pressure differential between the inner volume within the chamber and the outer volume within the chamber. A lower pressure in the outer volume within the chamber requires less outer chamber strength to withstand the lower pressure. A lower outer chamber strength requirement translates into an overall decrease in chamber size. It should be appreciated that the present invention can be implemented in numerous ways, including as a process, an apparatus, a system, a device, or a method. Several embodiments of the present invention are described below.

In one embodiment, a wafer cleaning chamber is disclosed. The wafer cleaning chamber includes a lower support having a number of support surfaces. The lower support contains a first volume that exists between the number of support surfaces. The wafer cleaning chamber further includes a plate supported by the number of support surfaces of the lower support. The plate overlies the first volume in the lower support. The plate also has a number of wafer support surfaces to receive and support a wafer. A second volume exists between the number of wafer support surfaces of the plate. Additionally, inlets and outlets are located in a periphery of the plate for introducing a fluid flow. The inlets and outlets are positioned outside a location intended to receive the wafer. The wafer cleaning chamber also includes an upper support overlying the plate. The upper support interfaces with the lower support at a location outside the periphery of the plate. A third volume within the upper support overlies the wafer to be supported by the plate. The third volume is capable of accommodating a fluid flow. The fluid flow can be introduced in a set configuration by the inlets and outlets of the plate. Also, the third volume is in limited fluid communication with the first volume and the second volume.

In another embodiment, a wafer processing apparatus is disclosed. The wafer processing apparatus includes a chamber having an upper portion and a lower portion. Support structures are distributed within a first volume that is defined in the lower portion of the chamber. Also, additional support structures are distributed within a second volume that is defined within the upper portion of the chamber. The wafer processing apparatus further includes a lower plate that is configured to be disposed on the support structures of the lower portion of the chamber. When disposed on the support structures, the lower plate overlies the first volume within the lower portion of the chamber. The lower plate includes a number of wafer support structures distributed within a third volume defined within the lower plate. The number of wafer support structures are capable of supporting a wafer. When the wafer is placed on the wafer support structures, the wafer overlies the third volume within the lower plate. The wafer processing apparatus also includes an upper plate configured to be attached to the support structures of the upper portion of the chamber. When the upper plate is attached to the support structures, the upper plate underlies the second volume defined within the upper portion of the chamber. The upper plate serves as an upper boundary of a fourth volume that exists between the upper plate and the wafer to be supported by the lower plate. The fourth volume is capable of containing a fluid. Also, the fourth volume is in limited fluid communication with the first volume, the second volume, and the third volume.

In another embodiment, a method for making a wafer processing chamber is disclosed. The method includes forming a lower support plate that has support surfaces distributed within a first volume that is defined within the lower support plate. The first volume is defined to have a first fluid inlet and a first fluid outlet. The method also includes forming a wafer support plate having wafer support surfaces distributed within a second volume that is defined within the wafer support plate. The wafer support surfaces are configured to receive a wafer. Once received, the wafer forms an upper boundary for the second volume defined within the wafer support plate. The second volume is defined to have a second fluid inlet and a second fluid outlet. Additionally, fluid inlets and fluid outlets are provided at a periphery of the wafer support plate and outside a location that is to receive the wafer. The method further includes securing the wafer support plate to the lower support plate. Once secured, the wafer support plate is supported by the support surfaces distributed within the first volume of the lower support plate. Also, the wafer support plate serves as an upper boundary for the first volume defined within the lower support plate. The method continues with the forming of an upper support plate that contains a third volume configured to overlie the wafer to be received by the wafer support surfaces of the wafer support plate. The method also includes securing the upper support plate to the lower support plate to isolate the third volume defined within the upper support plate from an outside environment. The isolation of the third volume from the outside environment is enabled by a seal disposed between the upper support plate and the lower support plate.

In another embodiment, a method for performing a wafer cleaning process is disclosed. The method includes providing a chamber in which the wafer cleaning process can be performed. The chamber includes a first volume configured to overlie a wafer to be cleaned. The chamber also includes a plate configured to support the wafer. A second volume is defined within the plate directly below the wafer. The plate includes fluid inlets and fluid outlets defined in a periphery of the plate and outside a portion of the plate defined to support the wafer. The fluid inlets and fluid outlets are oriented to direct a fluid flow through the first volume in a set pattern. Also in the chamber, a support structure is provided to support the plate. The support structure includes a third volume located directly below the plate. The method includes an operation for placing a wafer on the portion of the plate defined to support the wafer. The method further includes pressurizing the first volume to have a higher pressure than the second volume. The method also includes pressurizing the second volume to have a higher pressure than the third volume. The third volume is pressurized to have a pressure between that of the second volume and an environment outside the chamber. Also in the method, a fluid is provided to the first volume through the fluid inlets and is removed from the first volume through the fluid outlets, such that the fluid flows through the first volume in the set pattern. The fluid is formulated to effect the wafer cleaning process.

In another embodiment, a method is disclosed for cleaning a wafer. The method includes an operation for placing a wafer on a support plate. The support plate includes a number of fluid inlets and a number of fluid outlets defined in a periphery of the support plate. The periphery of the support plate is defined outside an area of the support plate on which the wafer is placed. The method also includes an operation for flowing a cleaning fluid over the wafer from the number of fluid inlets to the number of fluid outlets in a set fluid flow pattern. The set fluid flow pattern is defined by positions and orientations of the number of fluid inlets and the number of fluid outlets.

Other aspects and advantages of the invention will become more apparent from the following detailed description, taken in conjunction with the accompanying drawings, illustrating by way of example the present invention.

BRIEF DESCRIPTION OF THE DRAWINGS

The invention, together with further advantages thereof, may best be understood by reference to the following description taken in conjunction with the accompanying drawings in which.

DETAILED DESCRIPTION

An invention is disclosed for a wafer processing chamber "chamber" and a method for making the chamber. Broadly speaking, the present invention provides a chamber that allows a fluid flow and a fluid pressure within the chamber to be controlled in a variable manner. More specifically, the chamber of the present invention utilizes removable plates that can be configured to control the fluid flow and the fluid pressure in an inner volume within the chamber. Also, the removable plates can be used to separate the inner volume within the chamber from an outer volume within the chamber. In this manner, the removable plates can be used to create a pressure differential between the inner volume within the chamber and the outer volume within the chamber. A lower pressure in the outer volume within the chamber requires less outer chamber strength to withstand the lower pressure. A lower outer chamber strength requirement translates into an overall decrease in chamber size.

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1:
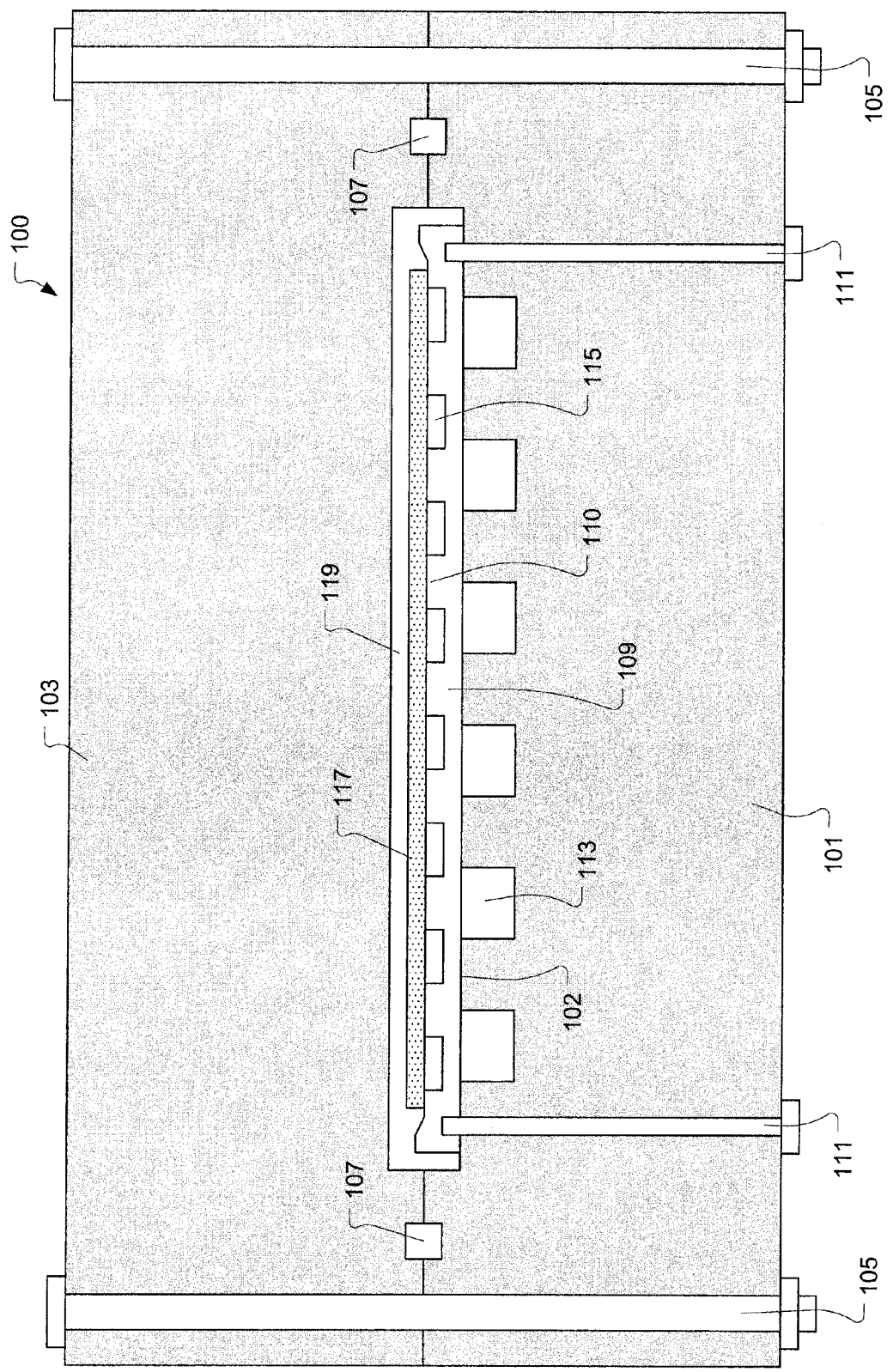
FIG. 1 is an illustration showing a vertical cross-section of a wafer processing chamber ("chamber"), in accordance with one embodiment of the present invention.

FIG. 1 is an illustration showing a vertical cross-section of a wafer processing chamber ("chamber") 100, in accordance with one embodiment of the present invention. In one embodiment, the chamber 100 can serve as a wafer cleaning chamber. The chamber 100 includes a lower support plate 101 having a number of support surfaces 102. The support surfaces 102 are distributed within an intermediate volume 113 defined within a top portion of the lower support plate 101. The support surfaces 102 are capable of supporting a lower plate 109 at discrete locations in a substantially uniform manner. The number and location of the support surfaces 102 depends on a pressure differential between the two sides of the lower plate 109. When placed on the support surfaces 102, the lower plate 109 serves as an upper boundary to the intermediate volume 113.

The lower plate 109 can be secured to the lower support plate 101 by a number of bolts 111. The lower plate 109 includes a number of wafer support surfaces 110 distributed to provide substantially uniform support to a wafer 117 to be disposed within the chamber 100. The lower plate 109 can be sized to allow the chamber 100 to process wafers of different sizes (e.g., 200 mm diameter, 300 mm diameter, etc. . . . ). The wafer support surfaces 110 are separated to form a lower volume 115. The lower volume 115 is located beneath the wafer 117 to be disposed on the lower plate 109. Hence, with respect to the wafer 117, the lower volume 115 is also referred to as an underlying volume 115.

The chamber 100 also includes an upper support plate 103 that is configured to interface with a top section of the lower support plate 101. The upper support plate 103 includes a wafer processing volume 119. The wafer processing volume 119 is configured to overlie the wafer 117 when the upper support plate 103 is attached to the lower support plate 101. When the wafer 117 is present in the chamber 100, the top surface of the wafer 117 is exposed to the wafer processing volume 119. Hence, with respect to the wafer 117, the wafer processing volume 119 is also referred to as an overlying volume 119.

A seal 107 is disposed between the upper support plate 103 and the lower support plate 101 at a peripheral location where the upper support plate 103 and the lower support plate 101 are in contact. The seal 107 traverses the periphery of the wafer processing volume 119 and serves to isolate the wafer processing volume 119 from an outside environment. To enable the seal 107, the upper support plate 103 and lower support plate 101 are forced together by a number of bolts 105 located outside a periphery of the seal 107. Some wafer processes must be performed at extremely high pressures. Thus, the upper support plate 103, the lower support plate 101, and the bolts 105 provide sufficient strength to withstand a pressure which may exist within the wafer processing volume 119.

Additionally, some wafer processes must be performed at specific temperatures. In order to provide temperature control within the wafer processing volume 119, thermal control devices can be disposed within the upper support plate 103 and the lower support plate 101. In one embodiment, the thermal control devices can include heat exchanger fluid pathways. In another embodiment, the thermal control devices can include electric heating elements. In either embodiment, conduction through the upper support plate 103, the lower support plate 101, and the lower plate 109 provide a transfer mechanism to move heat from the thermal control devices to the wafer processing volume 119.

Figure 2:
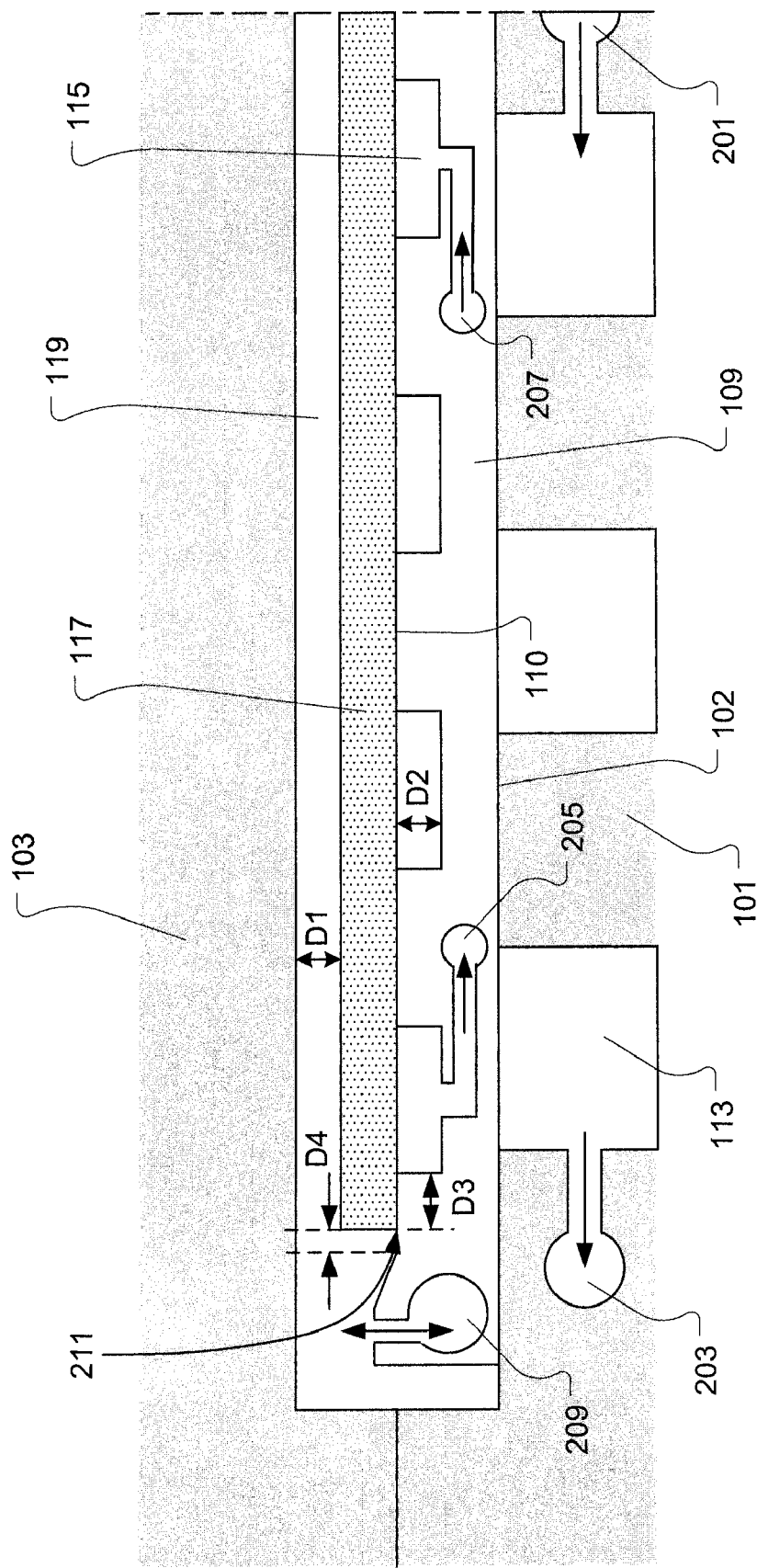
FIG. 2 is an illustration showing a close-up view of a central portion of the chamber as shown in FIG. 1, in accordance with one embodiment of the present invention.

FIG. 2 is an illustration showing a close-up view of a central portion of the chamber 100 as shown in FIG. 1, in accordance with one embodiment of the present invention. The close-up view shows a vertical cross-section of half of the chamber 100, including the upper support plate 103, the wafer processing volume 119, the wafer 117, the underlying volume 115, the lower plate 109, the intermediate volume 113, and the lower support plate 101.

As discussed with respect to FIG. 1, the lower plate 109 serves to support the wafer 117 by providing the wafer support surfaces 110 upon which the wafer 117 will be secured during wafer processing. Each of the wafer support surfaces 110 is a part of a discrete support structure. The discrete support structures corresponding to the wafer support surfaces 110 are distributed in a substantially uniform manner throughout the underlying volume 115. Therefore, the underlying volume 115 exists between the discrete support structures corresponding to the wafer support surfaces 110 and below the wafer 117. An inlet 207 is provided for introducing fluids into the underlying volume 115. An outlet 205 is provided for removing fluids from the underlying volume 115. In other embodiments, the inlet 207 and the outlet 205 can be disposed at other locations within the lower plate 109. A number of inlets/outlets 209 are also provided within the lower plate 109 to introduce and remove fluids from the wafer processing volume 119.

As discussed with respect to FIG. 1, the lower support plate 101 serves to support the lower plate 109 by providing the support surfaces 102 upon which the lower plate 109 will be secured during wafer processing. Each of the support surfaces 102 is a part of a discrete support structure. The discrete support structures corresponding to the support surfaces 102 are distributed in a substantially uniform manner throughout the intermediate volume 113. Therefore, the intermediate volume 113 exists between the discrete support structures corresponding to the support surfaces 102 and below the lower plate 109. An inlet 201 is provided for introducing fluids into the intermediate volume 113. An outlet 203 is provided for removing fluids from the intermediate volume 113. In other embodiments, the inlet 201 and the outlet 203 can be disposed at other locations within the lower support plate 101.

The wafer processing volume 119 is formed within the upper support plate 103 to overlie the wafer 117 when the upper support plate 103 is joined with the lower support plate 101. Since the wafer 117 is not hermetically sealed to the lower plate 109 during wafer processing, the wafer processing volume 119 will be in fluid communication with the underlying volume 115 through a limited fluid communication pathway 211 at the periphery of the wafer 117. The limited fluid communication pathway 211 is essentially the area between the wafer 117 and the peripheral wafer support surface 110 of the lower plate 109.

During operation, a pressure in the wafer processing volume 119 will be maintained at a higher level than a pressure in the underlying volume 115, thus creating a pressure differential through the wafer 117 from top to bottom. The pressure differential serves to push the wafer 117 toward the lower plate 109 with sufficient force to secure the wafer 117 to the wafer support surfaces 110. Since the pressure in the wafer processing volume 119 is higher than the pressure in the underlying volume 115, some fluid will pass from the wafer processing volume 119 through the limited fluid communication pathway 211 to the underlying volume 115. The outlet 205 can be used to remove fluid from the underlying volume 115 as necessary.

The dimensions of the wafer processing volume 119, the underlying volume 115, and the wafer support surfaces 110 can vary depending upon the requirements (e.g., pressure, fluid flow rate, fluid composition, etc. . . . ) of the wafer process to be performed. In one embodiment, a separation distance D1 between the upper support plate 103 and the wafer 117 top surface is about 0.04 inch. As used herein, the term "about" means within ±10% of a specified value. However, in other embodiments different values for D1 may be used. In one embodiment, a depth D2 of the underlying volume 115 between the wafer 117 and the lower plate 109 can be within a range extending from about 0.005 inch to about 0.04 inch. In a particular embodiment, the depth D2 is about 0.02 inch. In one embodiment, an overlap distance D3 between the wafer 117 and the peripheral wafer support surface 110 can be within a range extending from about 0.1 inch to about 0.5 inch. In a particular embodiment, the overlap distance D3 is about 0.25 inch. The overlap distance D3 is a key factor in establishing the pressure drop between the wafer processing volume 119 and the underlying volume 115, through the limited fluid communication pathway 211. In one embodiment, a wafer positioning tolerance D4 (i.e., nominal distance between the wafer 117 edge and a wafer pocket perimeter within the lower plate 109) can be within a range extending from about 0.025 inch to about 0.1 inch. The wafer positioning tolerance D4 may be dictated by a precision of a robot handling device.

The wafer support surfaces 110 are configured to contact a percentage of the wafer 117 commensurate with the pressure differential to be applied through the wafer 117. A higher pressure differential requires a higher percentage of the wafer 117 to be in contact with the wafer support surfaces 110. In one embodiment, the wafer support surfaces 110 can be in contact with a percentage of the wafer 117 surface within a range extending from about 5% to about 80%. In another embodiment, the wafer support surfaces 110 can be in contact with a percentage of the wafer 117 surface within a range extending from about 15% to about 25%. In yet another embodiment, the wafer support surfaces 110 can be in contact with about 20% of the wafer 117 surface. With a differential pressure within a range extending from about 1 atm to about 1.5 atm, the wafer support surfaces 110 can be in contact with a percentage of the wafer 117 surface within a range extending up to about 10%. With a differential pressure within a range extending from about 3 atm to about 4 atm, the wafer support surfaces 110 can be in contact with a percentage of the wafer 117 surface within a range extending from about 50% to about 70%.

It is preferable to minimize the percentage of the wafer 117 in contact with the wafer support surfaces 110 (i.e., wafer backside contact area). Minimization of the wafer backside contact area, however, should be performed in a manner that provides sufficient support for the particular pressure differential to be applied between the wafer processing volume 119 and the underlying volume 115. Minimizing the wafer backside contact area serves to reduce the potential for wafer 117 contamination. Also, minimizing the wafer backside contact area reduces the potential for particles becoming lodged between the wafer 117 and the wafer support surfaces 110, which could cause difficulty in securing the wafer 117.

Pressures in each of the wafer processing volume 119, the underlying volume 115, and the intermediate volume 113 can be controlled independently by controlling fluid introduction to and removal from each volume. The lower plate 109 allows the wafer processing volume 119 pressure to be adjusted relative to the intermediate volume 113 pressure. In this manner, the lower plate 109 allows a high pressure to be constrained within the wafer processing volume 119. In an alternate embodiment, the intermediate volume 113 can be overpressurized to cause a fluid to be introduced into the wafer processing volume 119 from the intermediate volume 113. Regardless, of the particular embodiment, however, the pressure differential between the two sides of the lower plate 109 dictates the required thickness of the lower plate 109. A larger pressure differential across the lower plate 109 requires the lower plate 109 to have a larger thickness. For the lower plate 109 to be thinner, the pressure differential between the wafer processing volume 119 and the intermediate volume 113 should be lower.

It is desirable to minimize the thickness of the lower plate 109 in order to reduce the volume of outer chamber 100 material and the chamber 100 overall size. However, a balance exists when determining the lower plate 109 thickness to use and the minimum intermediate volume 113 pressure to allow. A thinner lower plate 109 will reduce the overall chamber 100 size, but a lower intermediate volume 113 pressure will allow the use of a thinner lower support plate 101, by reducing a pressure differential between the intermediate volume 113 and an outside environment.

With an effective variation in pressure differential from the wafer processing volume 119 to the intermediate volume 113 to the outside environment, the chamber 100 size can be optimized. Thus, the use of multiple chamber internal volumes allows for a more compact chamber 100 design. Also, minimizing the size of the wafer processing volume 119 allows both the chamber size and the wafer processing cycle time to be reduced. A smaller wafer processing volume 119 requires less material to constrain the pressure within the wafer processing volume 119. Furthermore, a smaller wafer processing volume 119 requires less time to reduce the high pressure within the wafer processing volume 119 to a pressure at which the wafer 117 can be safely transferred, thus reducing the wafer processing cycle time.

As previously mentioned, the lower plate 109 includes the number of inlets/outlets 209 for introducing fluids to and removing fluids from the wafer processing volume 119. The inlets/outlets 209 are located near the periphery of the lower plate 109 and outside a location intended to receive the wafer 117. The inlets/outlets 209 can be configured to control a fluid flow through the wafer processing volume 119 over a top surface of the wafer 117. It is likely that different fluid flow patterns and pressures will work better for different wafer processing applications. The inlets/outlets 209 in the lower plate 109 can be configured to provide numerous fluid flow patterns within the wafer processing volume 119. In following, numerous lower plates 109 can be designed and manufactured to provide a selection of fluid flow patterns, thus allowing a suitable fluid flow pattern to be selected for a specific wafer process. Since the lower plates 109 are interchangeable, the fluid flow pattern through the wafer processing volume 119 can be changed without requiring other aspects of the chamber 100, beyond the lower plate 109, to be altered.

Figure 3:
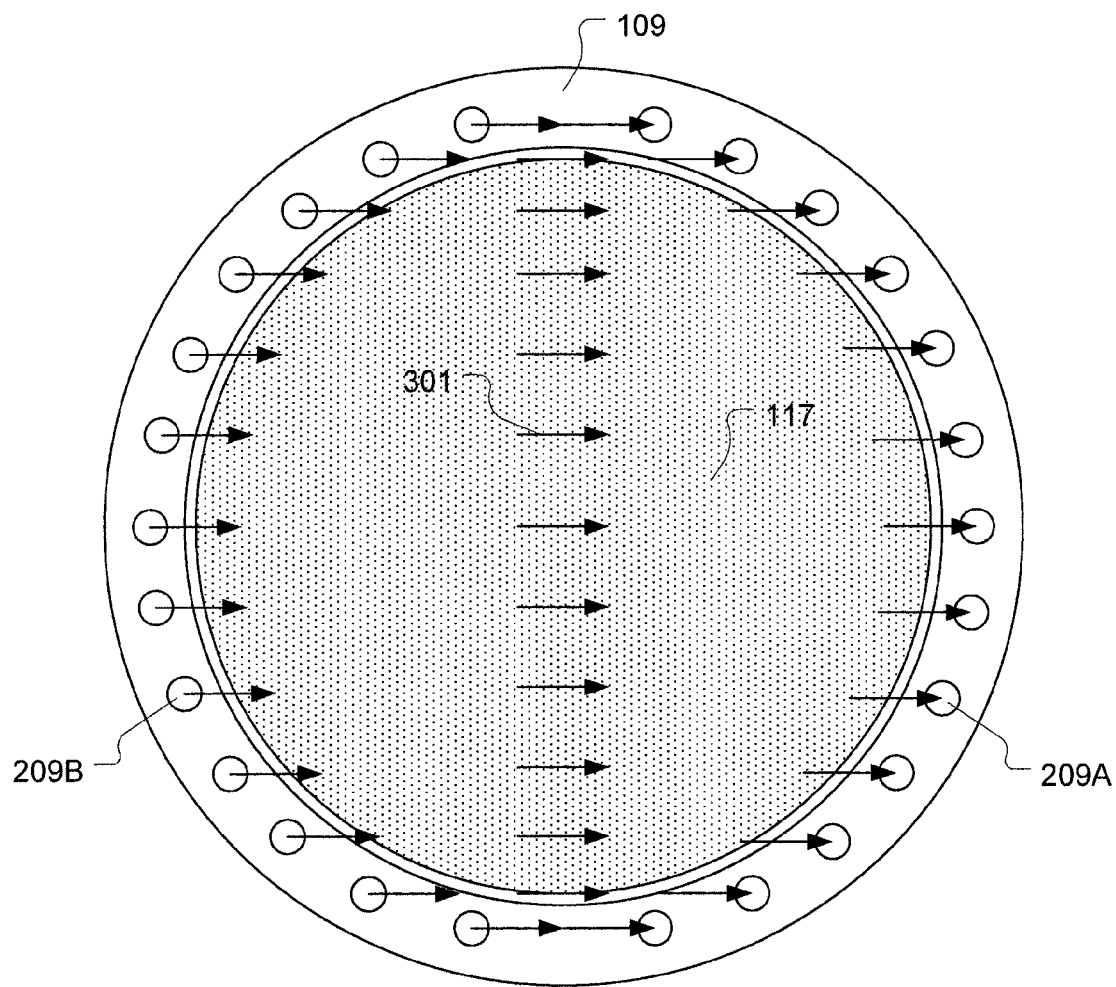
FIG. 3 is an illustration showing a top view of the lower plate configured to provide a linear fluid flow across the wafer, in accordance with one embodiment of the present invention.

FIG. 3 is an illustration showing a top view of the lower plate 109 configured to provide a linear fluid flow across the wafer 117, in accordance with one embodiment of the present invention. The lower plate 109 is defined to have a number of inlets 209B distributed in a substantially uniform manner around a 180 degree segment of the lower plate 109 periphery. The lower plate 109 is further defined to have a number of outlets 209A distributed in a substantially uniform manner around a 180 degree segment of the lower plate 109 periphery that is opposite the 180 degree segment containing the number of inlets 209B. The fluid is introduced into the wafer processing volume 119 through the number of inlets 209B. The fluid is removed from the wafer processing volume 119 through the number of outlets 209A. The disposition of the number of inlets 209B and the number of outlets 209A causes the fluid to flow in a linear pattern across the top surface of the wafer 117 as indicated by arrows 301.

Figure 4:
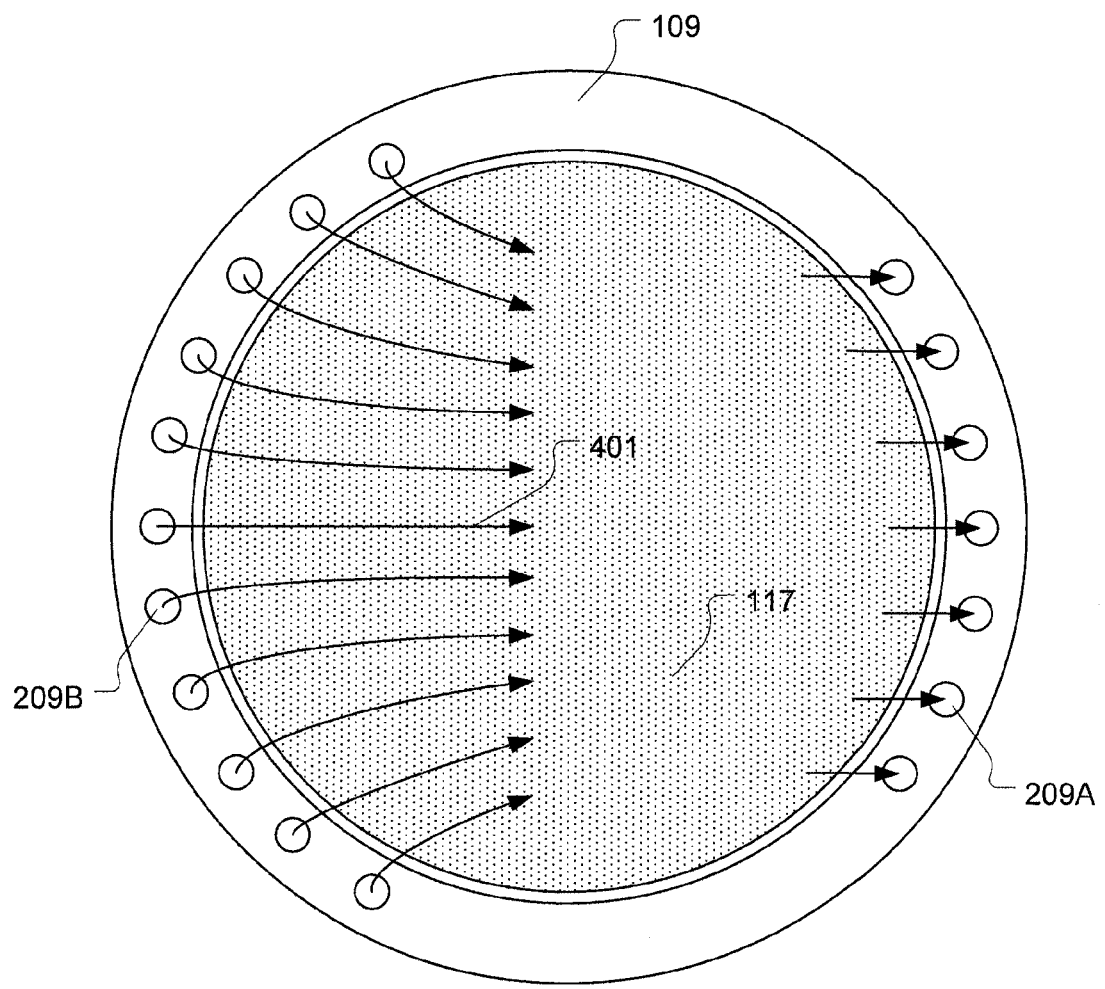
FIG. 4 is an illustration showing a top view of the lower plate configured to provide a conical fluid flow across the wafer, in accordance with one embodiment of the present invention.

FIG. 4 is an illustration showing a top view of the lower plate 109 configured to provide a conical fluid flow across the wafer 117, in accordance with one embodiment of the present invention. The lower plate 109 is defined to have a number of inlets 209B distributed in a substantially uniform manner around a segment of the lower plate 109 periphery that subtends an angle less than 180 degrees. The lower plate 109 is further defined to have a number of outlets 209A distributed in a substantially uniform manner around a segment of the lower plate 109 periphery that subtends an angle less than that subtended by the number of inlets 209B. The number of outlets 209A are positioned at a location opposite the number of inlets 209B. The fluid is introduced into the wafer processing volume 119 through the number of inlets 209B. The fluid is removed from the wafer processing volume 119 through the number of outlets 209A. The disposition of the number of inlets 209B and the number of outlets 209A causes the fluid to flow in a conical pattern across the top surface of the wafer 117 as indicated by arrows 401. The conical pattern can be optimized to allow the fluid flow to maintain a constantly accelerating velocity across the top surface of the wafer 117.

Figure 5:
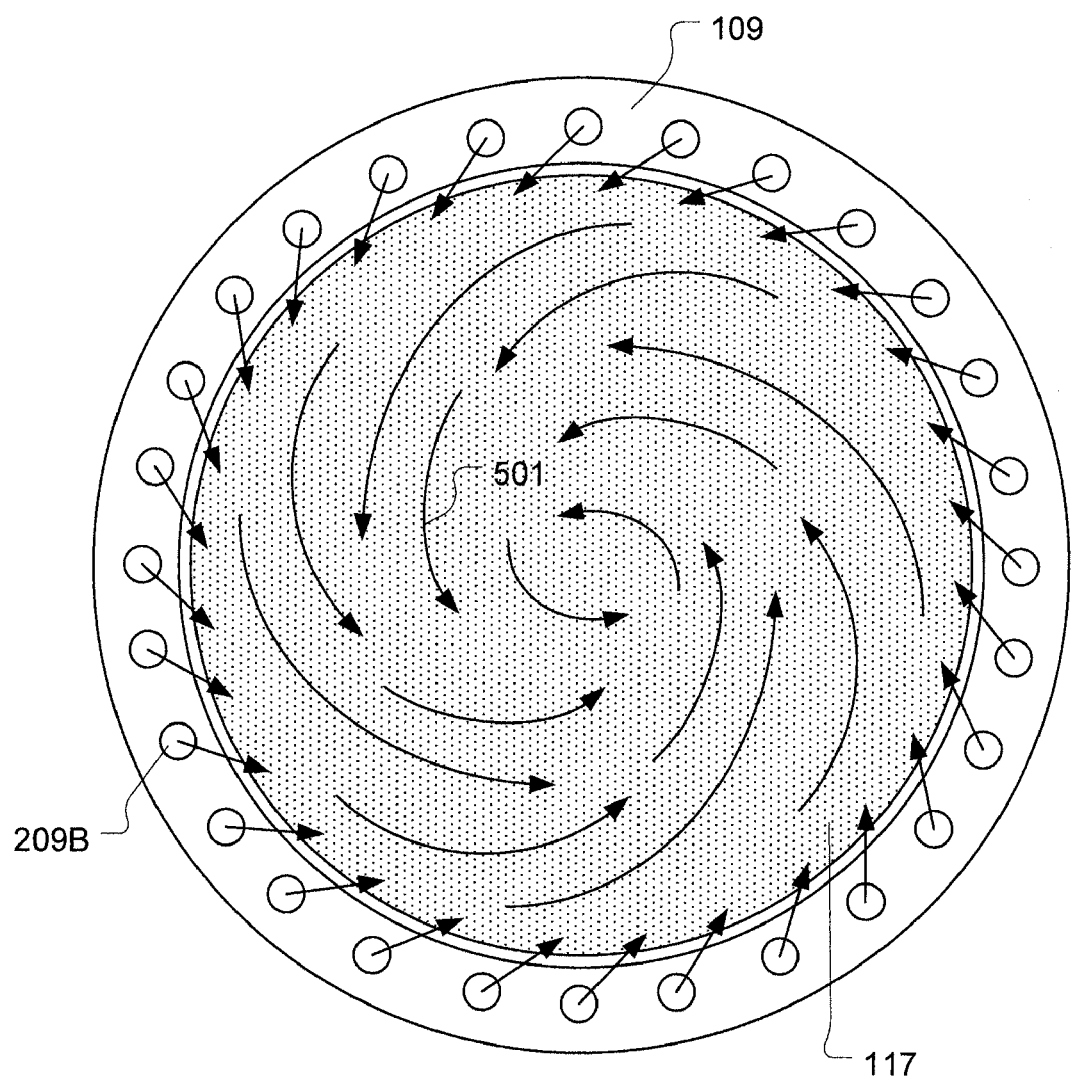
FIG. 5 is an illustration showing a top view of the lower plate configured to provide a spiral fluid flow across the wafer, in accordance with one embodiment of the present invention.

FIG. 5 is an illustration showing a top view of the lower plate 109 configured to provide a spiral fluid flow across the wafer 117, in accordance with one embodiment of the present invention. The lower plate 109 is defined to have a number of inlets 209B distributed in a substantially uniform manner around the lower plate 109 periphery. The fluid is introduced into the wafer processing volume 119 through the number of inlets 209B. The number of inlets 209B are configured to direct the fluid in a tangential direction with respect to the wafer 117. The configuration of the number of inlets 209B causes the fluid to flow in a spiral pattern across the top surface of the wafer 117 as indicated by arrows 501. In one embodiment, the fluid is removed from the wafer processing volume 119 through one or more outlets located in the upper support plate 103.

Figure 6:
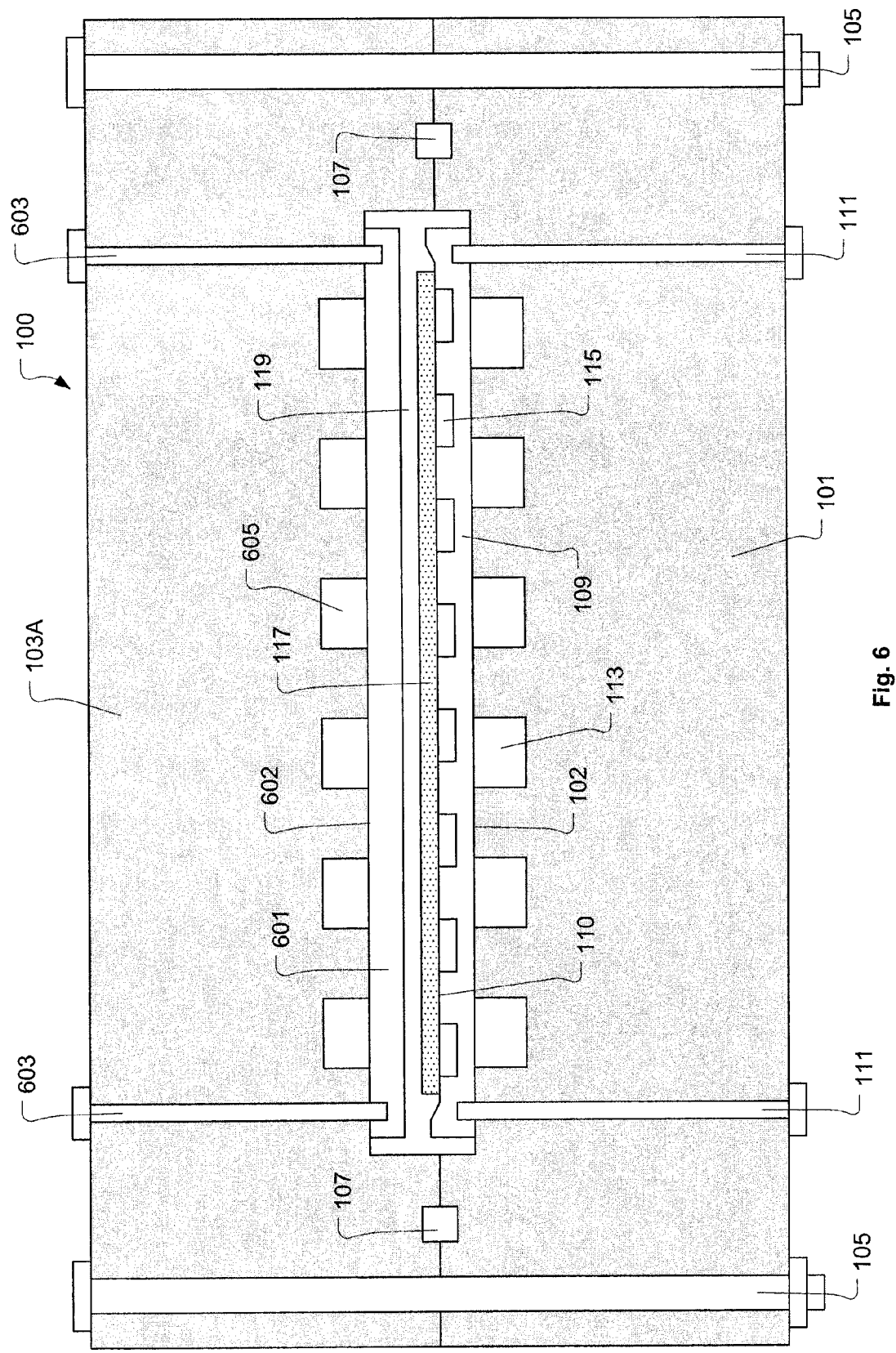
FIG. 6 is an illustration showing a vertical cross-section of the chamber incorporating an upper plate, in accordance with one embodiment of the present invention.

FIG. 6 is an illustration showing a vertical cross-section of the chamber 100 incorporating an upper plate 601, in accordance with one embodiment of the present invention. The chamber 100 incorporates the lower plate 109, the lower support plate 101, the bolts 111, the bolts 105, and the seal 107 as previously described with respect to FIG. 1. The chamber 100 embodiment illustrated in FIG. 6, however, incorporates a different upper support plate 103A.

The upper support plate 103A is configured to interface with the top section of the lower support plate 101. The upper support plate 103A includes a number of support surfaces 602. The support surfaces 602 are distributed within an intermediate volume 605 defined within a bottom portion of the upper support plate 103A. The support surfaces 602 are capable of supporting the upper plate 601 at discrete locations in a substantially uniform manner. The number and location of the support surfaces 602 depends on a pressure differential between the two sides of the upper plate 601. The upper plate 601 can be secured to the upper support plate 103A by a number of bolts 603. When secured to the upper support plate 103A, the upper plate 601 serves as a lower boundary to the intermediate volume 605.

The upper support plate 103A further includes the wafer processing volume 119. The wafer processing volume 119 is configured to overlie the wafer 117 when the upper support plate 103A is attached to the lower support plate 101. The wafer processing volume 119 is also configured to underlie the upper plate 601 when the upper plate 601 is secured to the upper support plate 103A. In this manner, the upper plate 601 serves as an upper boundary to the wafer processing volume 119.

Figure 7:
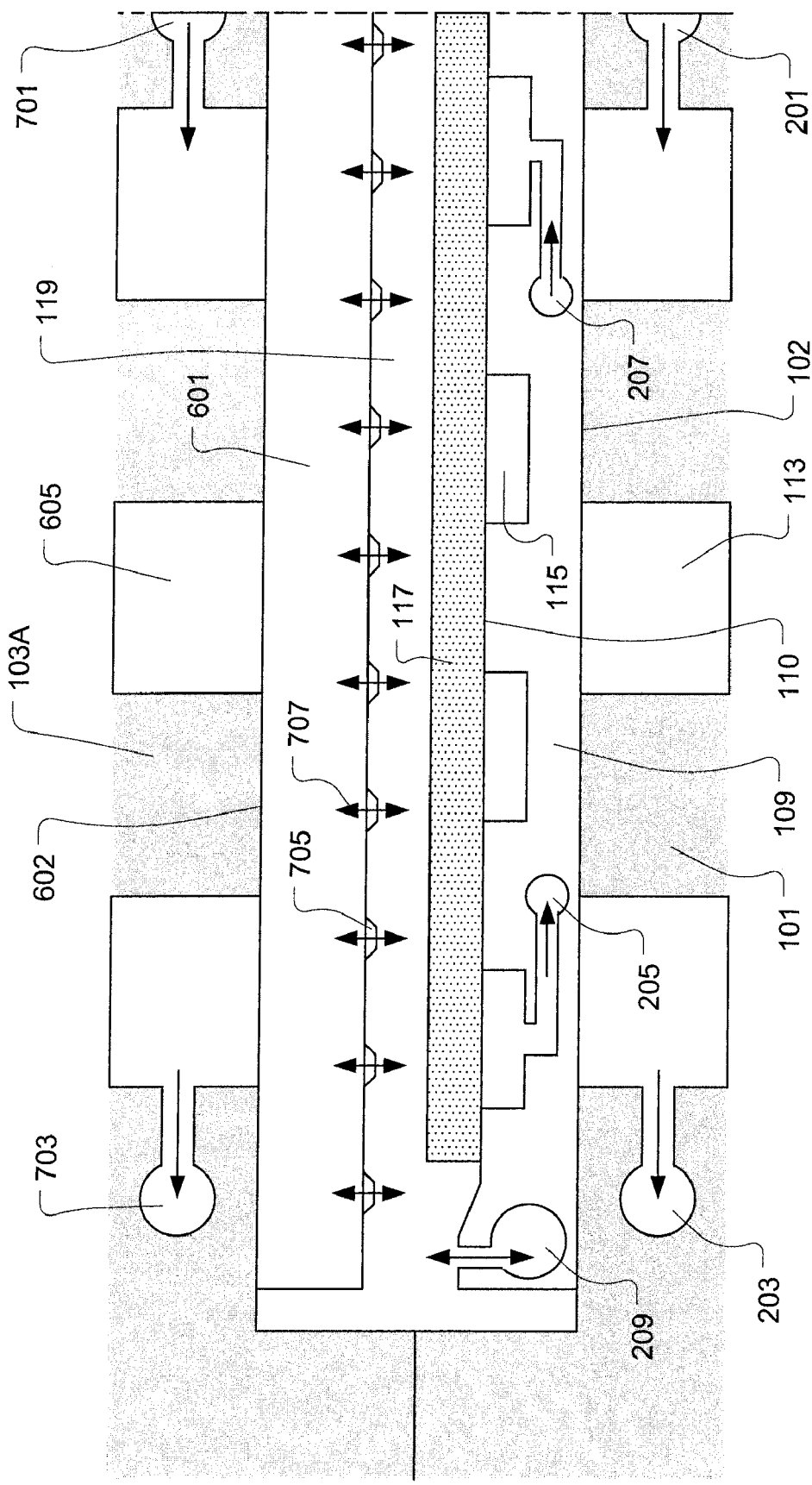
FIG. 7 is an illustration showing a close-up view of a central portion of the chamber as shown in FIG. 6, in accordance with one embodiment of the present invention.

FIG. 7 is an illustration showing a close-up view of a central portion of the chamber 100 as shown in FIG. 6, in accordance with one embodiment of the present invention. The close-up view shows a vertical cross-section of half of the chamber 100, including the upper support plate 103A, the upper plate 601, the intermediate volume 605, the wafer processing volume 119, the wafer 117, the underlying volume 115, the lower plate 109, the intermediate volume 113, and the lower support plate 101.

The lower plate 109, having the wafer support surfaces 110 distributed within the underlying volume 115 and containing the inlet 207, the outlet 205 and the inlet/outlet 209, is the same as previously described with respect to FIG. 2. Also, the lower support plate 101, having the support surfaces 102 distributed within the intermediate volume 113 and containing the inlet 201 and the outlet 203, is the same as previously described with respect to FIG. 2.

As discussed with respect to FIG. 6, the upper support plate 103A serves to support the upper plate 601 by providing the support surfaces 602 upon which the upper plate 601 will be secured during wafer processing. Each of the support surfaces 602 is a part of a discrete support structure. The discrete support structures corresponding to the support surfaces 602 are distributed in a substantially uniform manner throughout the intermediate volume 605. Therefore, the intermediate volume 605 exists between the discrete support structures corresponding to the support surfaces 602 and above the upper plate 601. An inlet 701 is provided for introducing fluids into the intermediate volume 605. An outlet 703 is provided for removing fluids from the intermediate volume 605. In other embodiments, the inlet 701 and the outlet 703 can be disposed at other locations within the upper support plate 103A.

Pressures in each of the wafer processing volume 119 and the intermediate volume 605 can be controlled independently by controlling fluid introduction to and removal from each volume. The upper plate 601 allows the wafer processing volume 119 pressure to be adjusted relative to the intermediate volume 605 pressure. In this manner, the upper plate 601 allows a high pressure to be constrained within the wafer processing volume 119. In an alternate embodiment, the intermediate volume 605 can be over-pressurized to cause a fluid to be introduced into the wafer processing volume 119 from the intermediate volume 605. Regardless, of the particular embodiment, however, the pressure differential between the two sides of the upper plate 601 dictates the required thickness of the upper plate 601. A larger pressure differential across the upper plate 601 requires the upper plate 601 to have a larger thickness. For the upper plate 601 to be thinner, the pressure differential between the wafer processing volume 119 and the intermediate volume 605 should be lower.

It is desirable to minimize the thickness of the upper plate 601 in order to reduce the volume of outer chamber 100 material and the chamber 100 overall size. However, a balance exists when determining the upper plate 601 thickness to use and the minimum intermediate volume 605 pressure to allow. A thinner upper plate 601 will reduce the overall chamber 100 size, but a lower intermediate volume 605 pressure will allow the use of a thinner upper support plate 103A, by reducing a pressure differential between the intermediate volume 605 and an outside environment. With an effective variation in pressure differential from the wafer processing volume 119 to the intermediate volume 605 to the outside environment, the chamber 100 size can be optimized.

The upper plate 601 includes a number of inlets/outlets 705 for introducing fluid to and removing fluid from the wafer processing volume 119, as indicated by arrows 707. The inlets/outlets 705 are distributed across the upper plate 601 and are configured to control the fluid flow through the wafer processing volume 119 over the top surface of the wafer 117. As previously mentioned, it is likely that different fluid flow patterns and pressures will work better for different wafer processing applications. The inlets/outlets 705 in the upper plate 601 can be configured to provide numerous fluid flow patterns within the wafer processing volume 119. Additionally, the inlets/outlets 705 in the upper plate 601 can be configured to work in conjunction with the inlets/outlets 209 in the lower plate 109 to provide fluid flow patterns within the wafer processing volume 119. In following, numerous upper plates 601 can be designed and manufactured to provide a selection of fluid flow patterns, thus allowing a suitable fluid flow pattern to be selected for a specific wafer process. As with the lower plates 109, the interchangeability of the upper plates 601 allows the fluid flow pattern through the wafer processing volume 119 to be changed without requiring other aspects of the chamber 100 to be changed.

Figure 8A:
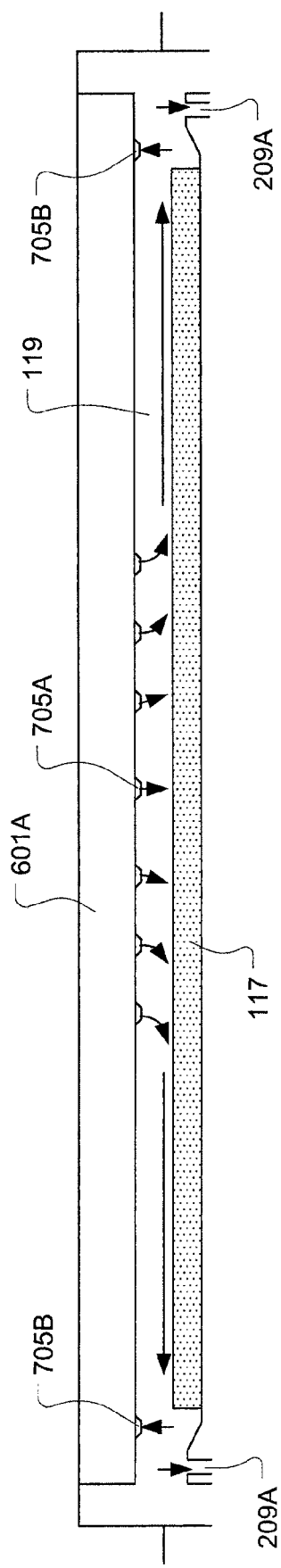
FIG. 8A is an illustration showing an upper plate configured to provide a central fluid feed and a peripheral fluid exhaust, in accordance with one embodiment of the present invention.

FIG. 8A is an illustration showing an upper plate 601A configured to provide a central fluid feed and a peripheral fluid exhaust, in accordance with one embodiment of the present invention. The upper plate 601A includes a number of inlets 705A distributed in a location near a center of the upper plate 601A. In one embodiment, the upper plate 601A includes a number of outlets 705B distributed about periphery of the upper plate 601A at a location near the periphery of the wafer 117. In another embodiment, the lower plate 109 includes a number of outlets 209A distributed in a substantially uniform manner around the periphery of the lower plate 109. In yet another embodiment, the upper plate 601A includes the number of outlets 705B and the lower plate 109 includes the number of outlets 209A. In either embodiment, the fluid is introduced into the wafer processing volume 119 through the number of inlets 705A and removed from the wafer processing volume 119 through the number of outlets 705B and/or 209A. The configuration of the number of inlets 705A and the number of outlets 705B and/or 209A causes the fluid to flow from a central region to a peripheral region of the wafer 117.

Figure 8B:
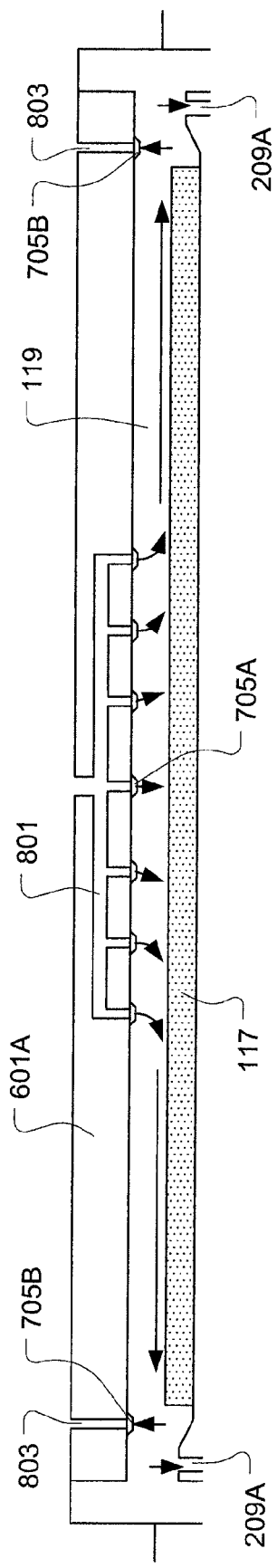
FIG. 8B is an illustration showing the use of fluid channels within the upper plate, in accordance with one embodiment of the present invention.

FIG. 8B is an illustration showing the use of fluid channels within the upper plate 601A, in accordance with one embodiment of the present invention. Fluid channels 801 are provided for transferring fluid to the number of inlets 705A. Fluid channels 803 are provided for transferring fluid from the number of outlets 705B. Use of fluid channels to independently control different inlets and outlets within the upper plate 601A allows for pressure equalization and flow pattern control within the wafer processing volume 119. Additionally, the use of fluid channels provides flexibility in changing flow patterns within the wafer processing volume 119 and in varying the pressure differential between the wafer processing volume 119 and the intermediate volume 605.

Figure 9:
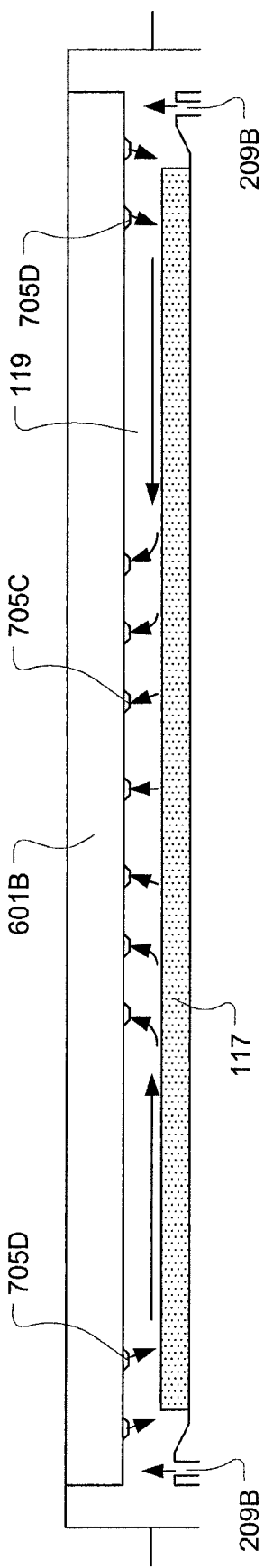
FIG. 9 is an illustration showing an upper plate configured to provide a peripheral fluid feed and a central fluid exhaust, in accordance with one embodiment of the present invention.

FIG. 9 is an illustration showing an upper plate 601B configured to provide a peripheral fluid feed and a central fluid exhaust, in accordance with one embodiment of the present invention. The upper plate 601B includes a number of outlets 705C distributed in a location near a center of the upper plate 601B. In one embodiment, the upper plate 601B includes a number of inlets 705D distributed about periphery of the upper plate 601B at a location near the periphery of the wafer 117. In another embodiment, the lower plate 109 includes a number of inlets 209B distributed in a substantially uniform manner around the periphery of the lower plate 109. In yet another embodiment, the upper plate 601B includes the number of inlets 705D and the lower plate 109 includes the number of inlets 209B. In either embodiment, the fluid is introduced into the wafer processing volume 119 through the number of inlets 705D and/or 209B and removed from the wafer processing volume 119 through the number of outlets 705C. The configuration of the number of inlets 705D and/or 209B and the number of outlets 705C causes the fluid to flow from a peripheral region to a central region of the wafer 117.

Figure 10:
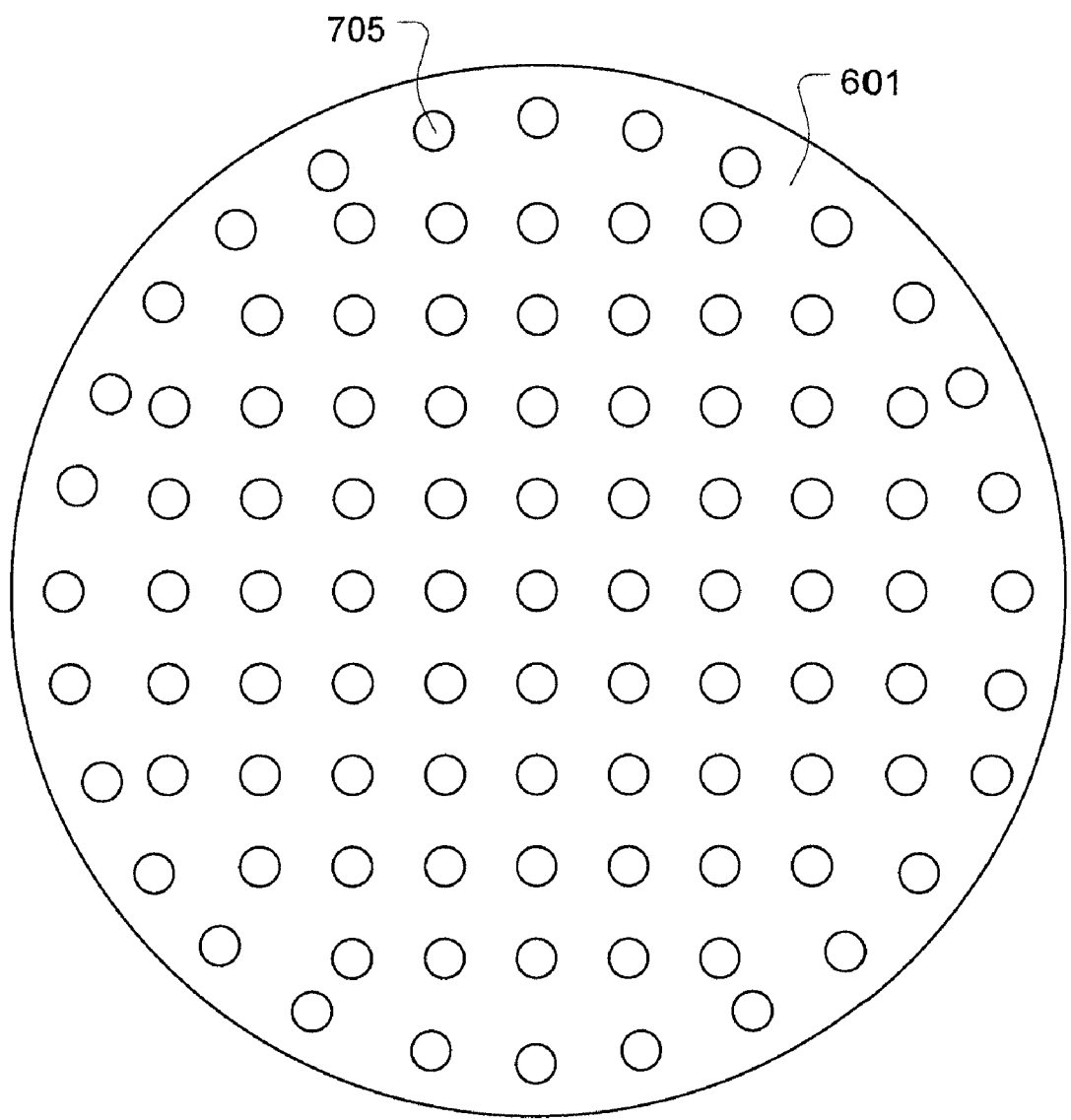
FIG. 10 is an illustration showing an exemplary distribution of the inlets/outlets across the upper plate, in accordance with one embodiment of the present invention.

FIG. 10 is an illustration showing an exemplary distribution of the inlets/outlets 705 across the upper plate 601, in accordance with one embodiment of the present invention. The number and distribution of inlets/outlets 705 will depend upon the desired fluid flow pattern to be applied within the wafer processing volume 119. The distribution of inlets/outlets 705 as shown in FIG. 10 provides an example of possible inlet/outlet 705 locations across the upper plate 601. Other inlet/outlet 705 numbers and distributions can be employed to satisfy the fluid flow pattern requirements of a particular wafer processing operation.

Figure 11:
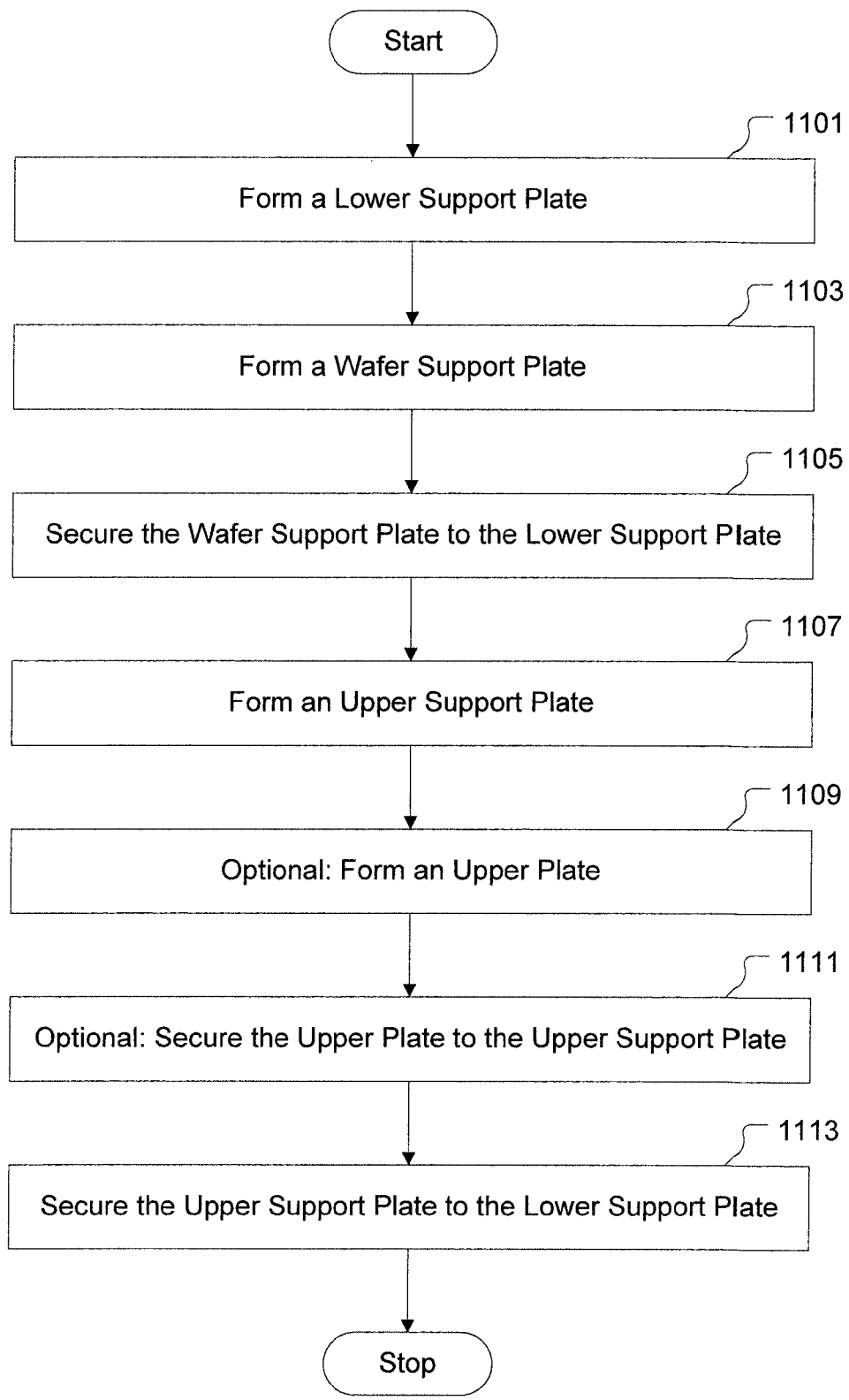
FIG. 11 is an illustration showing a flowchart of a method for making a wafer processing chamber, in accordance with one embodiment of the present invention.

FIG. 11 is an illustration showing a flowchart of a method for making a wafer processing chamber, in accordance with one embodiment of the present invention. The method includes an operation 1101 in which a lower support plate is formed. In one embodiment, the lower support plate is formed from stainless steel. In other embodiments, the lower support plate can be formed from other materials that are compatible with the processes to be performed within the wafer processing chamber. The forming can be accomplished by pouring molten material into a mold or by machining a block of material. The lower support plate is formed to have support surfaces distributed within a first volume defined within the lower support plate. The first volume is defined to have a first fluid inlet and a first fluid outlet. The lower support plate is capable of withstanding a pressure differential to be applied between volumes located at each side of the lower support plate.

The method also includes an operation 1103 in which a wafer support plate is formed. In one embodiment, the wafer support plate is formed from stainless steel. In other embodiments, the wafer support plate can be formed from other materials that are compatible with the processes to be performed within the wafer processing chamber. The forming can be accomplished by pouring molten material into a mold or by machining a block of material. The wafer support plate is formed to have wafer support surfaces distributed within a second volume defined within the wafer support plate. The wafer support surfaces are configured to receive a wafer. Once received, the wafer forms an upper boundary for the second volume defined within the wafer support plate. The second volume is defined to have a second fluid inlet and a second fluid outlet. Additionally, fluid inlets and fluid outlets are provided at a periphery of the wafer support plate and outside a location that is to receive the wafer. The peripheral fluid inlets and fluid outlets of the wafer support plate can be configured to create a fluid flow pattern within the third volume. In some embodiments, the fluid flow pattern can be either a linear pattern, a conical pattern, or a spiral pattern. In other embodiments, different fluid flow patterns can be created to satisfy the requirements of a wafer processing operation. The wafer support plate is capable of withstanding a pressure differential to be applied between volumes located at each side of the wafer support plate.

The method further includes an operation 1105 in which the wafer support plate is secured to the lower support plate. Once secured, the wafer support plate is supported by the support surfaces distributed within the first volume of the lower support plate. Also, the wafer support plate serves as an upper boundary for the first volume defined within the lower support plate.

The method continues with an operation 1107 in which an upper support plate is formed. In one embodiment, the upper support plate is formed from stainless steel. In other embodiments, the upper support plate can be formed from other materials that are compatible with the processes to be performed within the wafer processing chamber. The forming can be accomplished by pouring molten material into a mold or by machining a block of material. The upper support plate is formed to contain a third volume that is configured to overlie the wafer to be received by the wafer support surfaces of the wafer support plate. The upper support plate is capable of withstanding a pressure differential to be applied between volumes located at each side of the upper support plate.

In one embodiment, support surfaces are formed within the upper support plate. The support surfaces are distributed within a fourth volume. The fourth volume can have a fluid inlet and a fluid outlet. The support surfaces formed within the upper support plate are configured to receive and support an upper plate. In accordance with this embodiment, the method includes an optional operation 1109, in which the upper plate is formed. In one embodiment, the upper plate is formed from stainless steel. In other embodiments, the upper plate can be formed from other materials that are compatible with the processes to be performed within the wafer processing chamber. The forming can be accomplished by pouring molten material into a mold or by machining a block of material. The upper plate is formed to have fluid inlets and fluid outlets capable of introducing fluid to and removing fluid from third volume. The fluid inlets and fluid outlets of the upper plate can be configured to create a fluid flow pattern within the third volume. In some embodiments, the fluid flow pattern can be either a linear pattern, a conical pattern, a spiral pattern, a center feed with peripheral exhaust pattern, or a peripheral feed with center exhaust pattern. In other embodiments, different fluid flow patterns can be created to satisfy the requirements of a wafer processing operation. Also in accordance with this embodiment, the method includes an optional operation 1111, in which the upper plate is secured to the support surfaces of the upper support plate. In this manner, the upper plate serves as a lower boundary to the fourth volume and an upper boundary to the third volume. The upper plate is capable of withstanding a pressure differential between the fourth volume and the third volume.

The method also includes an operation 1113 in which the upper support plate is secured to the lower support plate. Securing the upper support plate to the lower support plate causes the third volume defined within the upper support plate to be isolated from an outside environment. Isolation of the third volume from the outside environment is enabled by a seal disposed between the upper support plate and the lower support plate.

Figure 12:
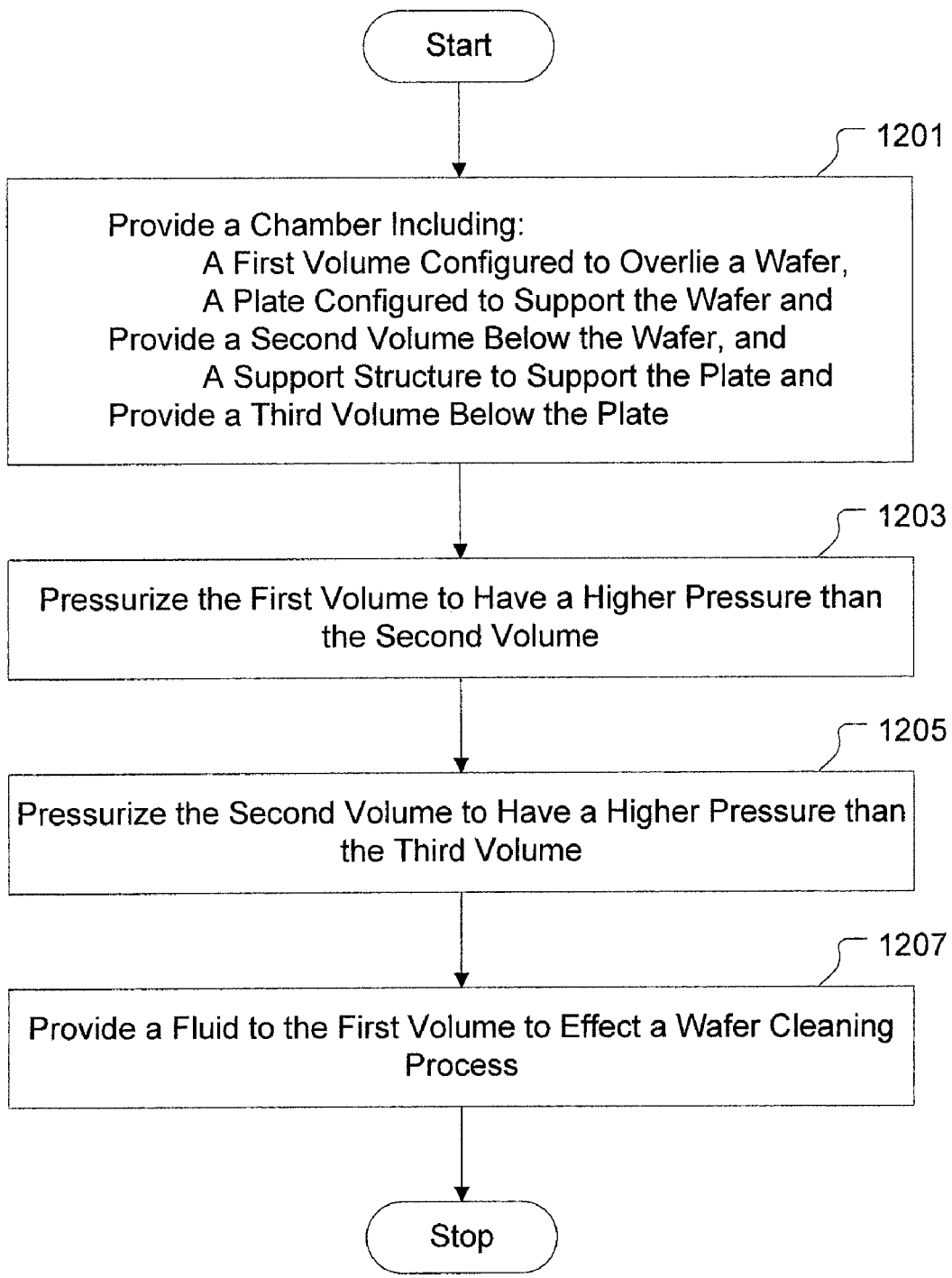
FIG. 12 is an illustration showing a flowchart of a method for performing a wafer cleaning process, in accordance with one embodiment of the present invention.

FIG. 12 is an illustration showing a flowchart of a method for performing a wafer cleaning process, in accordance with one embodiment of the present invention. The method includes an operation 1201 for providing a chamber in which the wafer cleaning process can be performed. The chamber includes a first volume configured to overlie a wafer to be cleaned. The chamber also includes a plate configured to support the wafer. A second volume is defined within the plate directly below the wafer. Also in the chamber, a support structure is provided to support the plate. The support structure includes a third volume located directly below the plate. The method further includes an operation 1203 for pressurizing the first volume to have a higher pressure than the second volume. Also in the method, an operation 1205 is provided for pressurizing the second volume to have a higher pressure than the third volume. The third volume is pressurized to have a pressure between that of the second volume and an environment outside the chamber. The method also includes an operation 1207 for providing a fluid to the first volume that overlies the wafer to be cleaned. The fluid is formulated to effect the wafer cleaning process. In one embodiment, the fluid is a supercritical fluid.

The wafer processing chamber of the present invention is well suited for use in a wafer process that utilizes a supercritical fluid. As previously described, the wafer processing chamber is suited for controlling the pressure within the wafer processing volume. Additionally, the wafer processing chamber is capable of controlling the pressure differentials that exist between the wafer processing volume, the intermediate volume of the chamber, and the outside environment. Having an ability to adjust the wafer processing volume pressure relative to the chamber intermediate volume pressure, as afforded by the present invention, can be valuable in designing a supercritical fluid processing chamber that is minimal in size. Also, in supercritical fluid wafer processing, the pressure within the wafer processing volume must be controlled to maintain the supercritical state of the fluid.

Figure 13:
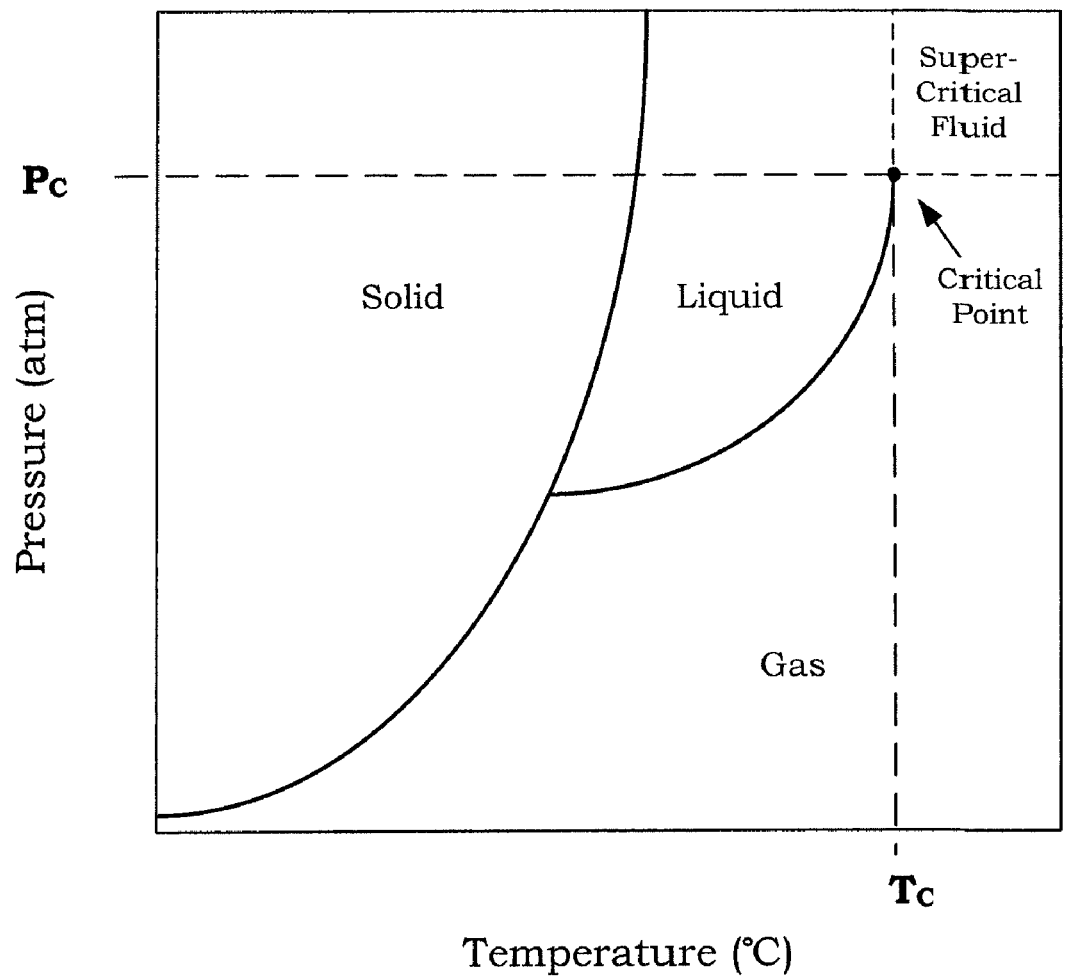
FIG. 13 is an illustration showing a generalized material phase diagram.

FIG. 13 is an illustration showing a generalized material phase diagram. The phase of the material is represented as regions of solid, liquid, and gas, wherein the presence of a particular phase is dependent on pressure and temperature. The gas-liquid phase boundary follows an increase in both pressure and temperature up to a point called the critical point. The critical point is delineated by a critical pressure ($P_c$) and a critical temperature ($T_c$). At pressures and temperatures beyond $P_c$ and $T_c$, the material becomes a supercritical fluid.

Wafer cleaning operations can be performed using the supercritical fluid. The supercritical fluid shares the properties of both a gas phase and a liquid phase. The supercritical fluid has near zero surface tension. Therefore, the supercritical fluid can reach into and between small features on the wafer surface. Also, the supercritical fluid has a diffusivity property similar to a gas. Therefore, the supercritical fluid can get into porous regions of wafer materials, such as low-K dielectric material, without becoming trapped. Additionally, the supercritical fluid has a density similar to a liquid. Therefore, more supercritical fluid can be transported to the wafer in a given amount of time as compared to a gas.

Wafer processing with the supercritical fluid must be performed at high pressures to maintain the supercritical state of the fluid. For example, supercritical fluid processing can be performed at pressures ranging from about 68 atm to about 273 atm. Therefore, the wafer processing chamber must be able to withstand the associated high pressures. The wafer processing chamber of the present invention is capable of withstanding and controlling the high pressures associated with supercritical fluids.

Generally speaking, in supercritical fluid processes, the wafer processing volume is pressurized and the temperature within the wafer processing volume is controlled. The wafer processing volume pressure and temperature are controlled to maintain a supercritical fluid state. In an exemplary embodiment, the wafer processing volume can be pre-pressurized with $CO_2$ only or with a mixture of $CO_2$ and an appropriate chemistry. The critical pressure and temperature for $CO_2$ is approximately 73 atm and 31° C., respectively. It should be noted that the supercritical fluid used in combination with the wafer processing chamber of the present invention is not restricted to $CO_2$. Other suitable supercritical fluids can also be used. Additionally, the chemistry of the supercritical fluid may include additives such as co-solvents, co-chelating agents, surfactants, or any combination thereof. The additives contained within the supercritical fluid can be useful for performing specific functions, such as dissolving and removing photoresist, dissolving and removing organic residue, and chelating metals, among others.

The advantages of the wafer processing chamber of the present invention are numerous. One advantage is that the wafer processing chamber is completely configurable. By interchanging the upper and lower plates, the chamber can be converted to several different configurations without changing the main chamber body. This advantage allows one type of chamber to be used for several potential wafer processing applications. Also, the interchangeability of the upper and lower plates allows the wafer processing volume pressure and flow pattern to be appropriately selected for a particular wafer processing application. Additionally, during a wafer cleaning process, there is a potential that material being cleaned from the wafer can become trapped in cavities within the chamber. Since the upper and lower plates are removable, both the chamber and the upper and lower plates can be more easily cleaned.

The wafer processing chamber of the present invention can be incorporated into a wafer processing cluster architecture. In one example, the wafer processing cluster architecture can incorporate separate modules for performing wafer cleaning operations, wafer etching operations, CMP operations, and wafer rinsing operations. Additionally, in the wafer processing cluster architecture, the wafer can be transferred between different modules using a robotic wafer handling mechanism or a track mechanism.

While this invention has been described in terms of several embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A method for performing a wafer cleaning process, comprising:
    providing a chamber, including,
        a first volume configured to overlie a wafer;
        a plate configured to support a wafer, the plate further configured to define a second volume directly below the wafer when the wafer is supported on the plate, the plate including fluid inlets and fluid outlets defined in a periphery of the plate and outside a portion of the plate defined to support the wafer, the fluid inlets and fluid outlets oriented to direct a fluid flow through the first volume in a set pattern;
        a support structure configured to support the plate, the support structure further configured to define a third volume directly below the plate;
    placing a wafer on the portion of the plate defined to support the wafer;
    pressurizing the first volume, the second volume, and the third volume, the pressurizing causing the first volume to have a higher pressure than the second volume, the pressurizing further causing the second volume to have a higher pressure than the third volume; and
    providing a fluid to the first volume through the fluid inlets and removing the fluid from the first volume through the fluid outlets such that the fluid flows through the first volume in the set pattern, the fluid being formulated to effect a wafer cleaning process.

2. A method for performing a wafer cleaning process as recited in claim 1, wherein the fluid is a supercritical fluid.

3. A method for performing a wafer cleaning process as recited in claim 1, wherein the chamber is provided as part of a wafer processing cluster architecture.

4. A method for performing a wafer cleaning process as recited in claim 1, further comprising:
    allowing the fluid to move from the first volume to the second volume, and from the second volume to the third volume.

5. A method for performing a wafer cleaning process as recited in claim 1, wherein a higher pressure of the first volume relative to a pressure of the second volume serves to hold the wafer on the plate.

6. A method for performing a wafer cleaning process as recited in claim 1, further comprising:
    controlling a pressure differential between the second volume and the third volume within a ranges extending from about 1 atm to about 4 atm.

7. A method for performing a wafer cleaning process as recited in claim 1, wherein the set pattern of the fluid flow through the first volume is one of a linear flow pattern, a conical flow pattern, and a spiral flow pattern.

8. A method for performing a wafer cleaning process as recited in claim 1, wherein the plate includes a number of support surfaces upon which the wafer is supported, and wherein the second volume exists between the number of support surfaces of the plate and below the wafer when the wafer is supported on the plate.

9. A method for performing a wafer cleaning process as recited in claim 8, wherein the number of support surfaces are distributed in a substantially uniform manner across the portion of the plate defined to support the wafer.

10. A method for performing a wafer cleaning process as recited in claim 1, wherein the chamber includes an upper structure having a cavity defined therein, the method including an operation for securing the upper structure to the support structure such that the upper structure interfaces with the support structure outside a periphery of the plate, and such that the cavity within the upper structure defines the first volume.

11. A method for performing a wafer cleaning process as recited in claim 10, wherein the upper structure is secured to the support structure so as to form a seal at the interface between the upper structure and the support structure, wherein the seal serves to isolate the first volume from an environment outside of the chamber.

12. A method for cleaning a wafer, comprising:
    placing a wafer on a number of support structures of a support plate so as to form an underlying volume between the wafer and the support plate and between the number of support structures of the support plate, the support plate including a number of first fluid inlets and a number of first fluid outlets defined in a periphery of the support plate, the periphery of the support plate defined outside an area of the support plate on which the wafer is placed, the number of first fluid inlets and the number of first fluid outlets defined to provide a flow of a cleaning fluid through a wafer processing volume above the wafer, the support plate including a second fluid inlet and a second fluid outlet defined provide a flow of a pressurizing fluid through the underlying volume;

enclosing the wafer processing volume over the wafer in a sealed manner;

flowing the cleaning fluid over the wafer through the wafer processing volume from the number of first fluid inlets to the number of first fluid outlets in a set fluid flow pattern, wherein the set fluid flow pattern is defined by positions and orientations of the number of first fluid inlets and the number of first fluid outlets;

flowing the pressurizing fluid through the underlying volume from the second fluid inlet to the number of second fluid outlet; and controlling a first pressure in the wafer processing volume to be greater than a second pressure in the underlying volume.

13. A method for cleaning a wafer as recited in claim 12, wherein the cleaning fluid is a supercritical fluid, and wherein the pressure within the wafer processing volume is controlled to maintain the cleaning fluid in a supercritical state.

14. A method for cleaning a wafer as recited in claim 12, wherein the set fluid flow pattern is one of a linear flow pattern, a conical flow pattern, and a spiral flow pattern.

* * * * *